United States Patent [19]
Roh et al.

[11] Patent Number: 5,705,440
[45] Date of Patent: Jan. 6, 1998

[54] METHODS OF FABRICATING INTEGRATED CIRCUIT FIELD EFFECT TRANSISTORS HAVING REDUCED-AREA DEVICE ISOLATION REGIONS

[75] Inventors: Byung-hyug Roh; Ki-nam Kim, both of Kyungki-do, Rep. of Korea

[73] Assignee: Samsung Electronics Co., Ltd., Suwon, Rep. of Korea

[21] Appl. No.: 681,875

[22] Filed: Jul. 29, 1996

[30] Foreign Application Priority Data

Sep. 13, 1995 [KR] Rep. of Korea ............... 95-29827

[51] Int. Cl.$^6$ ............................................. H01L 21/265
[52] U.S. Cl. .................................. 438/294; 438/307
[58] Field of Search .................... 437/228, 67, 44

[56] References Cited

U.S. PATENT DOCUMENTS

| | | | |
|---|---|---|---|
| 4,593,459 | 6/1986 | Poppert et al. | 437/62 |
| 4,683,637 | 8/1987 | Varker et al. | 437/60 |
| 5,480,832 | 1/1996 | Muira et al. | 437/62 |
| 5,488,010 | 1/1996 | Wong | 437/67 |
| 5,491,099 | 2/1996 | Hsu | 437/35 |
| 5,492,858 | 2/1996 | Bose et al. | 437/228 |

FOREIGN PATENT DOCUMENTS

| | | | |
|---|---|---|---|
| 59-19347 | 1/1984 | Japan | 437/67 |
| 60-57950 | 4/1985 | Japan | 437/62 |
| 0132342 | 7/1985 | Japan . | |
| 61-16543 | 1/1986 | Japan | 437/67 |
| 0237435 | 10/1988 | Japan . | |
| 6097274 | 4/1994 | Japan . | |

*Primary Examiner*—John Niebling
*Assistant Examiner*—Michael S. Lebentritt
*Attorney, Agent, or Firm*—Myers Bigel Sibley & Sajovec, L.L.P.

[57] ABSTRACT

A integrated circuit field effect transistor is formed with device isolation regions disposed on opposite sides of the transistor, each of which include a shallow insulation-filled trench region which abuts an insulating region underlying an active region of the transistor. A pair of spaced apart insulation-filled trench regions are formed in a semiconductor substrate at a surface of the substrate. An insulated gate is formed on the substrate between and separated from the insulation-filled trench regions. Spaced apart source and drain insulating regions are formed in the substrate, a respective one of which is disposed between the insulated gate and a respective one of the insulation-filled trench regions. Corresponding spaced apart source and drain regions are then formed on the spaced apart source and drain insulating regions. The insulated gate is formed overlying a channel region disposed between lightly doped source and drain regions.

13 Claims, 2 Drawing Sheets

METHODS OF FABRICATING INTEGRATED CIRCUIT FIELD EFFECT TRANSISTORS HAVING REDUCED-AREA DEVICE ISOLATION REGIONS

FIELD OF THE INVENTION

The present invention relates to semiconductor manufacturing methods, and more particularly, to methods of manufacturing integrated circuit field effect transistors with device isolation regions.

BACKGROUND OF THE INVENTION

Increased integration of integrated circuit devices generally requires reduction of the size of the transistors used in the devices in order to incorporate more transistors into the integrated circuit. To reduce the size of the transistors, it is generally desirable to reduce the area of the active regions, e.g., the source, drain, and gate, of the transistors. In addition, it generally is desirable to reduce the area of the device isolation regions used to separate the active regions of adjacent transistors in the semiconductor substrate on which the transistors are formed.

One technique for forming device isolation regions involves the local oxidation of silicon (LOCOS). According to this technique, an insulating oxide layer is grown between active transistor regions, e.g., between adjacent sources/drains of adjacent transistors, by thermally oxidizing the silicon substrate regions between the active regions. However, the oxidation process tends to extend laterally across the face of the substrate as well as vertically into the regions, producing so-called "bird's beaks" at the edges of the active regions which may encroach on and undesirably narrow the active regions. In addition, the field oxide layers formed in wider device isolation regions tend to be thicker than those formed in narrower device isolation regions, making it difficult to achieve the desired oxide thickness in some areas of the substrate.

An alternative to the LOCOS techniques is a trench isolation method whereby a semiconductor substrate is etched to form trenches separating active regions of the substrate, and the trenches filled with an insulating material such as a deposited oxide to form a device isolation region. Although effective for less integrated devices, this trench isolation technique generally is not suitable for very large scale integrated circuits, e.g., memory devices beyond 1 gigabit DRAM capacity. To reduce separation between the transistors, the trenches generally must be very narrow. To maintain sufficient device isolation characteristics, however, the trenches generally must also be relatively deep, resulting in trenches which may be difficult to fill without creating voids or other defects.

SUMMARY OF THE INVENTION

In light of the foregoing, it is an object of the present invention to provide methods for manufacturing device isolation regions which allow higher density integration of transistors.

It is another object of the present invention to provide methods for manufacturing integrated circuit transistors with device isolation regions which maintain device isolation while reducing the area occupied by the device isolation regions.

These and other objects, features and advantages are provided according to the present invention by methods for fabricating an integrated circuit field effect transistor in which insulation-filled trench regions are formed abutting the source and drain regions of the transistor at the surface of a substrate, with source and drain insulating regions being formed underlying and abutting the source and drain regions, respectively. An insulated gate is formed on the substrate between the source and drain regions, overlying a channel formed between the source and drain regions and a pair of lightly-doped regions is formed between the source and drain regions and the channel.

By forming insulation-filled trench regions abutted by the source and drain insulating regions, the present invention provides isolation regions which overcome some of the problems associated with device isolation regions produced by techniques such as local oxidation and conventional trench isolation. The insulation-filled trench can be made narrow without requiring increased depth, because the abutting source and drain isolation regions can effectively increase the isolation capability of the trench. Because the trench regions can be shallower, the probability of the occurrence of voids and other fabrication defects during filling of the trench regions may be reduced. Because the insulation-filled trench regions can be produced without local oxidation of the substrate surface adjacent the transistor active regions, lateral encroachment of the device isolation regions into the active regions can be reduced.

In particular, according to the present invention, to fabricate an integrated circuit field effect transistor, a pair of spaced apart insulation-filled trench regions are formed in a semiconductor substrate at a surface of the substrate. An insulated gate is formed on the substrate between and separated from the insulation-filled trench regions. Spaced apart source and drain insulating regions are formed in the substrate, a respective one of which is disposed between the insulated gate and a respective one of the insulation-filled trench regions. Corresponding spaced apart source and drain regions are formed on the spaced apart source and drain insulating regions.

The insulation-filled trench regions are formed by etching a pair of trenches in the surface of the semiconductor substrate. An insulation layer is then formed on the substrate, and portions of the insulation layer removed to expose surface portions of the semiconductor region disposed between the trenches and create a pair of insulation-filled trench regions.

The insulated gate is formed by forming a first insulation layer on the substrate, forming a conductive layer on the first insulation layer, and forming a second insulation layer on the conductive layer. Portions of the second insulation layer and the conductive layer are removed to form a gate protector, formed from the second insulation layer, overlying a gate electrode formed from the conductive layer and laterally separated from the insulation-filled trench regions by exposed portions of the first insulation layer. Ions are implanted into portions of the semiconductor region underlying the exposed portions of the first insulation layer to form a pair of lightly-doped impurity regions, a respective one of which is laterally disposed between the channel region and a respective one of the insulation-filled trench regions. A masking layer is then formed on the substrate and portions of the masking layer anisotropically removed to expose the gate protector and portions of the first insulation layer laterally disposed between the gate electrode and the insulation-filled trench regions and leave masking regions disposed adjacent sidewall portions of the gate electrode and the gate protector. Portions of the first insulation layer and the lightly doped impurity regions disposed between the masking regions and the insulation-filled trench regions are then removed to form an insulated gate overlying a channel region and a pair of lightly-doped source and drain regions disposed adjacent and on opposite sides of the channel region, the insulated gate including a gate electrode formed from the conductive layer and a gate insulator formed from the first insulation layer. The conductive layer may include one of doped polysilicon or tungsten polycide, and the second insulation layer may include silicon nitride.

To form spaced apart source and drain insulating regions, barrier regions, preferably including silicon nitride, are formed adjacent exposed sidewall portions of the masking regions, the gate insulator, the lightly-doped source and drain regions, and the insulation-filled trench regions. Exposed portions of the semiconductor substrate between the barrier regions are then oxidized to form a source insulating region disposed between the lightly doped source region and one of the insulation-filled trench regions and a drain insulating region disposed between the lightly doped drain region and a second of the insulation-filled trench regions. To form the barrier regions, a barrier layer is formed on the substrate and anisotropically etched to leave barrier regions disposed adjacent sidewall portions of the masking regions, the lightly-doped source and drain regions and barrier regions and the insulation-filled trench regions.

To form the spaced apart source and drain regions, a polysilicon layer is formed on the substrate, and a masking material layer formed on the polysilicon layer. Portions of the masking material layer are removed to expose portions of the polysilicon layer overlying the insulated gate and the insulation-filled trench regions and to leave spaced apart masking material regions overlying the spaced apart source and drain insulating regions. Exposed portions of the polysilicon layer overlying the insulated gate and the insulation-filled trench regions are removed to expose the insulated gate and the insulation-filled trench regions. The masking material layer is then removed to expose spaced apart polysilicon regions overlying the spaced apart source and drain insulating regions, and ions implanted into the spaced apart polysilicon regions to form spaced apart source and drain regions overlying the spaced apart source and drain insulating regions. The masking material layer may include one or more of photoresist, spin-on glass, and borophosphosilicate glass.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION

Figure 1:
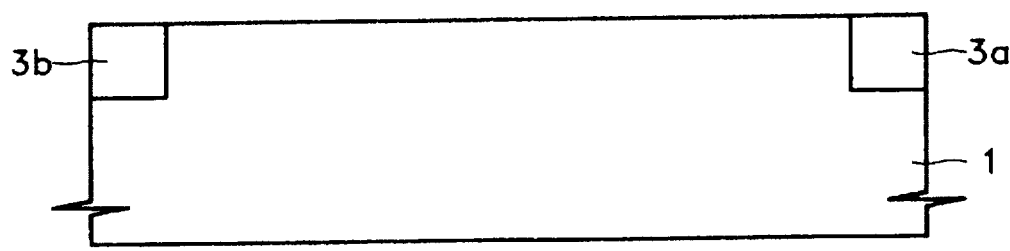
FIG. 1 illustrate operations for forming insulation-filled trench regions in a semiconductor substrate according to the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

FIG. 1 illustrates operations for forming a pair of insulation-filled trench regions 3a, 3b in a substrate 1. A pair of trenches are etched in the semiconductor substrate 1. Next, an insulation layer, such as a chemical vapor deposited (CVD) oxide layer, is formed on the substrate 1, filling the trenches. Portions of the insulation layer are removed to leave the insulation-filled trench regions 3a, 3b and to expose portions of the semiconductor substrate 1 disposed between the trench regions 3a, 3b.

Figure 2:
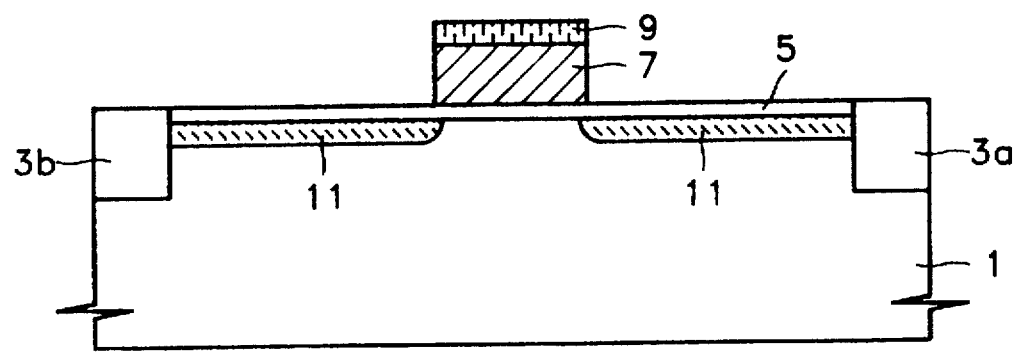
FIG. 2 illustrates operations for forming an insulated gate according to the present invention.

FIG. 2 illustrates operations for forming a gate protector 9, a gate electrode 7, and lightly doped impurity regions 11 which may be subsequently used to form lightly-doped source and drain regions. A first insulation layer 5 is formed on the substrate 1, for example, by thermal oxidation of the substrate 1. A conductive layer and a second insulation layer are then formed on the first insulation layer 5, and selectively removed to leave a gate electrode 7, formed from the conductive layer, and a gate protector 9, formed from the second insulation layer. The conductive layer preferably is formed by deposition of doped polysilicon or tungsten polycide, and the second insulation layer preferably is formed of silicon nitride so that the gate protector 9 on the gate may prevent oxidation and removal of the gate electrode 7 during subsequent thermal oxidation and etching operations. To form a pair of spaced apart low-concentration impurity regions 11 disposed at opposite sides of the gate electrode 7, ions are implanted into regions of the substrate 1 disposed between the gate electrode 7 and the insulation-filled trench regions 3a, 3b.

Figure 3:
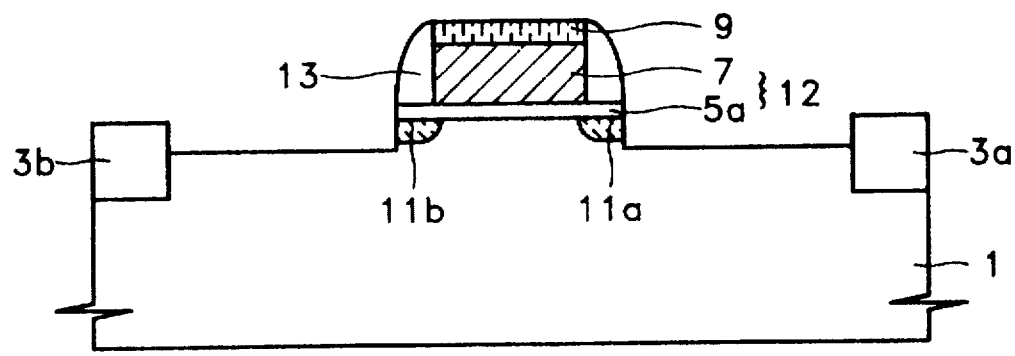
FIG. 3 illustrates operations for forming an insulated gate according to the present invention.

FIG. 3 illustrates operations for forming masking regions 13 disposed adjacent the gate electrode 7 and the gate protector 9, so that an insulated gate 12, including the gate electrode 7 and a gate insulator 5a, may be formed overlying lightly doped source and drain regions 11a, 11b. A masking layer is formed, preferably by CVD oxide deposition, on the semiconductor substrate 1. The masking layer is then anisotropically etched to form masking regions 13 on sidewall portions of the gate electrode 7 and the gate protector 9. Portions of the first insulation layer 5, the low-concentration impurity regions 11, and the substrate 1 are then removed to form an insulated gate 12, including a gate insulator 5a underlying the gate electrode 7, to form lightly doped source and drain regions 11a, 11b on opposite sides of a channel region underlying the insulated gate 12, and to expose sidewall portions of the insulation-filled trench regions 3a, 3b.

Figure 4:
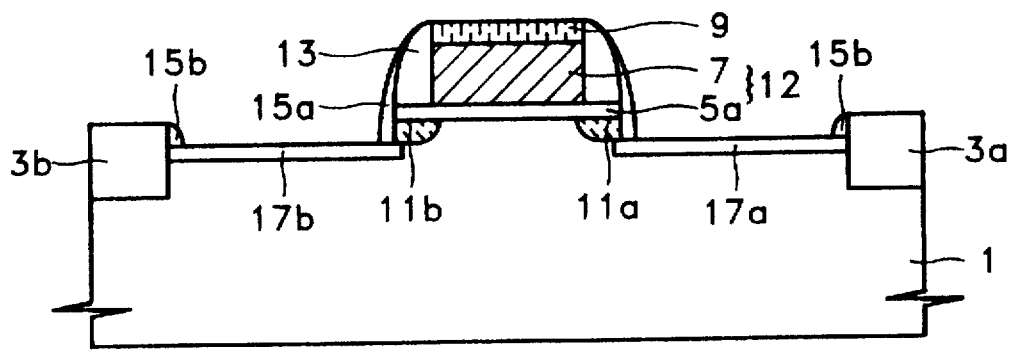
FIG. 4 illustrates operations for forming spaced apart source and drain insulating regions according to the present invention.

FIG. 4 illustrates operations for forming source and drain insulating regions 17a, 17b, between the insulated gate 12 and the insulation-filled trench regions 3a, 3b. A barrier layer, preferably including silicon nitride, is formed on the substrate 1. The barrier layer is anisotropically etched to form barrier regions 15a adjacent sidewall portions of the masking regions 13, the gate insulator 5a, and the lightly-doped source and drain regions 11a, 11b, and barrier regions 15b adjacent sidewall portions of the insulation-filled trench regions 3a, 3b. Those skilled in the art will understand that if the gate protector 9 is formed of the same material as the barrier layer, the barrier layer may need to be carefully removed to prevent the removal of gate protector 9. Portions of the substrate disposed between the barrier regions 15a, 15b are then oxidized, preferably thermally, to form spaced apart source and drain insulating regions 17a, 17b, adjacent the insulation-filled trench regions 3a, 3b. Preferably, the source and drain insulating regions 17a, 17b have an oxide thickness of about 300 Å. The barrier regions 15a, 15b are then removed, preferably using a phosphoric acid ($H_3PO_4$) solution. Preferably, the gate protector 9 is of a thickness such that it is not removed during the removal of the barrier regions 15a, 15b.

Figure 5:
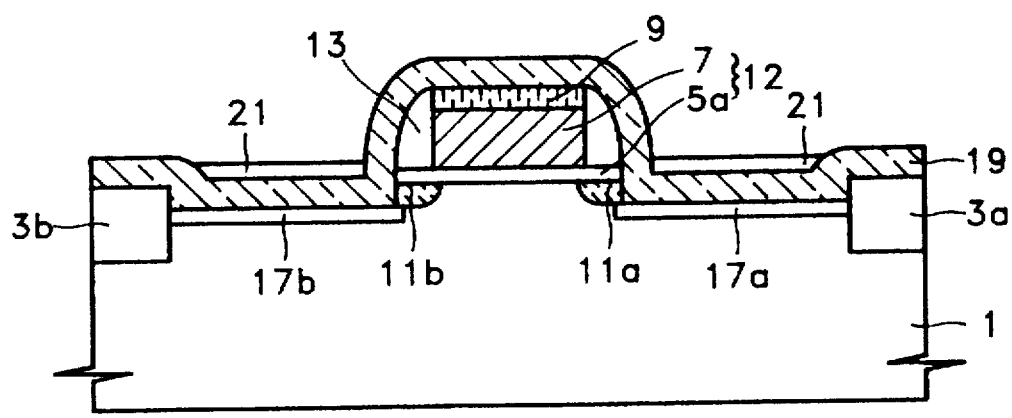
FIGS. 5 and 6 illustrate operations for forming spaced apart source and drain regions according to the present invention.
Figure 6:
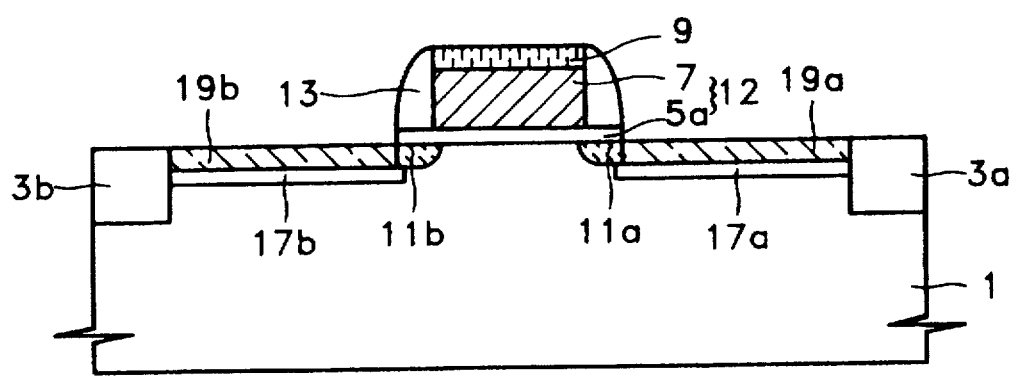

FIG. 5 and FIG. 6 illustrate operations for forming source and drain regions 19a, 19b overlying the source and drain insulating regions 17a, 17b. A polysilicon layer 19 is formed on the substrate, and a masking material layer formed on the polysilicon layer 19, preferably including one or more of photoresist, spin-on-glass (SOG) and borophosphosilicate glass (BPSG). Subsequently, the masking material layer is etched to expose portions of the polysilicon layer 19 overlying the insulated gate 12 and the insulation-filled trench regions 3a, 3b, and to leave spaced apart masking material regions 21 overlying the spaced apart source and drain insulating regions 17a, 17b.

The exposed polysilicon layer portions are then etched using the masking material regions 21 as a mask, to form spaced apart polysilicon regions overlying the spaced apart source and drain insulating regions 17a, 17b. The masking material regions 21 are then removed, and ions implanted into the spaced apart polysilicon regions to form source and drain regions 19a, 19b. As shown, the source and drain insulating regions 17a, 17b and the insulation-filled trenches 3a, 3b form device isolation regions abutting the source and drain regions 19a, 19b.

Therefore, according to the embodiment of the present invention, the effective distance between source (or drain) regions of two adjacent transistors is greatly increased. Even if the width and depth of a trench region for device isolation are very small, the device isolation characteristics can be considerably improved by the source and drain insulating regions. In other words, the integration of a semiconductor device can be enhanced by forming narrow trench regions. Also, the trench region can be filled completely with the insulation layer due to the shallow depth of the trench region.

Those skilled in the art will understand that, according to the present invention, various material formulations may be used for the semiconductor substrate 1 and the active source and drain regions 19a, 19b, 11a, 11b formed in and on the substrate 1. For example, the semiconductor substrate 1, and the ions implanted to form the spaced apart source and drain regions 19a, 19b and the lightly-doped source and drain regions 11a, 11b, may have various conductivity types and concentrations, depending on the operating characteristics desired for the transistor. In addition, those skilled in the art will appreciate that the transistors described herein may be formed as symmetrical devices, and thus the positioning of the source and drain regions within a transistor, and the relative positioning of adjacent source/drain regions of adjacent transistors, may be interchangeable.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A method of fabricating an integrated circuit field effect transistor, the method comprising the steps of:

forming a pair of spaced apart insulation-filled trench regions in a semiconductor substrate at a surface of the substrate;

forming an insulated gate on the substrate between and separated from a respective one of the insulation-filled trench regions by a respective exposed portion of the semiconductor substrate;

forming spaced apart insulating regions in the substrate, a respective one of which is disposed between the insulated gate and a respective one of the insulation-filled filled trench regions, wherein said step of forming spaced apart insulating regions comprises the steps of:

forming barrier regions adjacent sidewall portions of the insulated gate and the insulation-filled trench regions; and oxidizing exposed portions of the semiconductor substrate between the barrier regions to form a source insulating region disposed between the insulated gate and one of the insulation-filled trench regions and a drain insulating region disposed between the insulated gate and a second of the insulation-filled trench regions; and forming corresponding spaced apart source and drain regions on the spaced apart insulating regions.

2. A method according to claim 1 wherein said step of forming a pair of spaced apart insulation-filled trench regions comprises the steps of:

etching a pair of trenches in the surface of the semiconductor substrate;

forming an insulation layer on the substrate; and removing portions of the insulation layer to expose surface portions of the semiconductor substrate disposed between the trenches and create a pair of insulation-filled trench regions.

3. A method of fabricating an integrated circuit field effect transistor, the method comprising the steps of:

forming a pair of spaced apart insulation-filled trench regions in a semiconductor substrate at a surface of the substrate;

forming an insulated gate on the substrate between and separated from the insulation-filled trench regions, wherein said step of forming an insulated gate comprises the steps of:

forming a first insulation layer on the substrate between the insulation-filled trench regions;

forming a conductive layer on the first insulation layer;

forming a second insulation layer on the conductive layer;

removing portions of the second insulation layer and the conductive layer to form a gate protector, formed from the second insulation layer, overlying a gate electrode formed from the conductive layer and laterally separated from the insulation-filled trench regions by exposed portions of the first insulation layer;

implanting ions into portions of the semiconductor substrate underlying the exposed portions of the first insulation layer to form a pair of lightly-doped impurity regions, a respective one of which is laterally disposed between a channel region and a respective one of the insulation-filled trench regions, underlying the gate electrode;

forming a masking layer on the substrate;

anisotropically removing portions of the masking layer to expose the gate protector and portions of the first insulation layer laterally disposed between the gate electrode and the insulation-filled trench regions and leave masking regions disposed adjacent sidewall portions of the gate electrode and the gate protector; and removing portions of the first insulation layer and the lightly doped impurity regions disposed between the masking regions and the insulation-filled trench regions to form an insulated gate, including the gate electrode and a gate insulator formed from the first insulation region, overlying the channel region and a pair of lightly-doped source and drain regions disposed adjacent to and on opposite sides of the channel region, and to expose sidewall portions of the insulation-filled trench regions;

forming spaced apart insulating regions in the substrate, a respective one of which is disposed between the insulated gate and a respective one of the insulation-filled trench regions; and forming corresponding spaced apart source and drain regions on the spaced apart insulating regions.

4. A method according to claim 3 wherein the conductive layer comprises one of doped polysilicon or tungsten polycide, and wherein the second insulation layer comprises silicon nitride.

5. A method according to claim 3 wherein said step of forming spaced apart insulating regions comprises the step of:

forming barrier regions adjacent sidewall portions of the masking regions, the gate insulator, the lightly-doped source and drain regions, and the insulation-filled trench regions; and oxidizing exposed portions of the semiconductor substrate between the barrier regions to form an insulating region disposed between the lightly doped source region and one of the insulation-filled trench regions and an insulating region disposed between the lightly doped drain region and a second of the insulation-filled trench regions.

6. A method according to claim 5 wherein the barrier regions comprise silicon nitride.

7. A method according to claim 5 wherein said step of forming barrier regions comprises the steps of:

forming a barrier layer on the substrate; and anisotropically etching the barrier layer to leave barrier regions disposed adjacent sidewall portions of the masking regions, the gate insulator, the lightly-doped source and drain regions and the insulation-filled trench regions.

8. A method according to claim 7 wherein the barrier layer and the barrier regions comprise silicon nitride.

9. A method according to claim 5 wherein said step of forming spaced apart source and drain regions comprises the steps of:

removing the barrier regions to expose sidewall portions of the lightly-doped source and drain regions;

forming a polysilicon layer on the substrate;

forming a masking material layer on the polysilicon layer;

removing portions of the masking material layer to expose portions of the polysilicon layer overlying the insulated gate and the insulation-filled trench regions and to leave spaced apart masking material regions overlying the spaced apart insulating regions;

removing exposed portions of the polysilicon layer overlying the insulated gate and the insulation-filled trench regions to expose the gate protector and the insulation-filled trench regions;

removing the masking material regions to expose spaced apart polysilicon regions overlying the spaced apart insulating regions; and implanting ions into the spaced apart polysilicon regions to form spaced apart source and drain regions overlying the spaced apart insulating regions.

10. A method according to claim 9 wherein the masking material layer comprises one of photoresist, spin-on glass, and borophosphosilicate glass.

11. A method for forming device isolation regions for separating adjacent integrated circuit field effect transistors in a semiconductor substrate, the method comprising the steps of:

forming an insulation-filled trench region in the substrate;

forming an insulated gate for each of the adjacent transistors on the semiconductor substrate, a respective one of which is spaced apart from and on opposite sides of the insulation-filled trench region forming insulating regions in the substrate between the insulated gates of the adjacent transistors and the insulation-filled trench region, wherein said step of forming insulating regions in the substrate comprises the steps of:

forming barrier regions adjacent sidewall portions of the insulated gates and the insulation-filled trench region; and oxidizing exposed portions of the semiconductor substrate disposed between the barrier regions to produce spaced apart insulating regions, a respective one of which is disposed between the insulation-filled trench region and a respective one of the insulated gates; and forming active regions on the insulating regions.

12. A method for forming device isolation regions for separating adjacent integrated circuit field effect transistors in a semiconductor substrate, the method comprising the steps of:

forming an insulation-filled trench region in the substrate;

forming an insulated gate for each of the adjacent transistors on the semiconductor substrate, a respective one of which is spaced apart from and on opposite sides of the insulation-filled trench region;

forming insulating regions in the substrate between the insulated gates of the adjacent transistors and the insulation-filled trench region;

forming a polysilicon layer overlying the substrate;

forming a masking material layer on the polysilicon layer;

removing portions of the masking material layer to expose portions of the polysilicon layer overlying the insulated gates and the insulation-filled trench region and to leave masking material regions overlying the insulating regions;

removing the exposed portions of the polysilicon layer overlying the insulated gates and the insulation-filled trench region to expose the insulated gates and the insulation-filled trench region;

removing the masking material layer to expose regions of the polysilicon layer overlying the insulating regions; and implanting ions into the exposed regions overlying the insulating regions to form active regions overlying the insulating regions.

13. A method of fabricating an integrated circuit field effect transistor, the method comprising the steps of:

etching a pair of trenches in a surface of a semiconductor substrate;

forming an insulation layer on the substrate;

removing portions of the insulation layer to expose surface portions of the semiconductor substrate disposed between the trenches and create a pair of insulation-filled trench regions;

forming a first insulation layer on the substrate between the insulation-filled trench regions;

forming a conductive layer on the first insulation layer;

forming a second insulation layer on the conductive layer;

removing portions of the second insulation layer and the conductive layer to form a gate protector, formed from the second insulation layer, overlying a gate electrode formed from the conductive layer and laterally separated from the insulation-filled trench regions by exposed portions of the first insulation layer;

implanting ions into portions of the semiconductor substrate underlying the exposed portions of the first insulation layer to form a pair of lightly-doped impurity regions, a respective one of which is laterally disposed between the channel region and a respective one of the insulation-filled trench regions;

forming a masking layer on the substrate;

anisotropically removing portions of the masking layer to expose the gate protector and portions of the first insulation layer laterally disposed between the gate electrode and the insulation-filled trench regions and leave masking regions disposed adjacent sidewall portions of the gate electrode and the gate protector;

removing portions of the first insulation layer and the lightly doped impurity regions disposed between the masking regions and the insulation-filled trench regions to form an insulated gate, including the gate electrode and a gate insulator formed from the first insulation layer, overlying a channel region and a pair of lightly-doped source and drain regions disposed adjacent to and on opposite sides of the channel region, and to expose sidewall portions of the insulation-filled trench regions;

forming a barrier layer on the substrate;

anisotropically etching the barrier layer to leave barrier regions disposed adjacent sidewall portions of the masking regions, the gate insulator, the lightly-doped source and drain regions and the insulation-filled trench regions;

oxidizing exposed portions of the semiconductor substrate between the barrier regions to form an insulating region disposed between the lightly doped source region and one of the insulation-filled trench regions and an insulating region disposed between the lightly doped drain region and a second of the insulation-filled trench regions;

removing the barrier regions to expose sidewall portions of the lightly doped source and drain regions;

forming a polysilicon layer on the substrate;

forming a masking material layer on the polysilicon layer;

removing portions of the masking material layer to expose portions of the polysilicon layer overlying the insulated gate and the insulation-filled trench regions and to leave spaced apart masking material regions overlying the spaced apart insulating regions;

removing exposed portions of the polysilicon layer overlying the insulated gate and the insulation-filled trench regions to expose the insulated gate and the insulation-filled trench regions;

removing the masking material layer to expose spaced apart polysilicon regions overlying the spaced apart insulating regions; and implanting ions into the spaced apart polysilicon regions to form spaced apart source and drain regions overlying the spaced apart insulating regions.

* * * * *